US008221827B2

(12) United States Patent
Tokue et al.

(10) Patent No.: US 8,221,827 B2
(45) Date of Patent: Jul. 17, 2012

(54) PATTERNING METHOD

(75) Inventors: Hiroshi Tokue, Kanagawa (JP); Ikuo Yoneda, Kanagawa (JP); Shinji Mikami, Kanagawa (JP); Takumi Ota, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 506 days.

(21) Appl. No.: 12/549,232

(22) Filed: Aug. 27, 2009

(65) Prior Publication Data
US 2010/0072647 A1 Mar. 25, 2010

(30) Foreign Application Priority Data
Sep. 19, 2008 (JP) ................................. 2008-240760

(51) Int. Cl.
*B05D 5/00* (2006.01)
(52) U.S. Cl. ............ 427/8; 427/259; 427/264; 427/270; 427/277; 356/237.3; 438/694; 438/16; 438/763
(58) Field of Classification Search ................ 427/8–10, 427/256, 258, 259, 261, 264, 270, 271, 277; 264/40.1; 356/237.3; 438/694, 16, 763
See application file for complete search history.

(56) References Cited

U.S. PATENT DOCUMENTS
7,815,824 B2 * 10/2010 Sreenivasan et al. ........ 264/40.1
2007/0246850 A1 10/2007 Schumaker FOREIGN PATENT DOCUMENTS
| JP | 6-313756 | 11/1994 |
|---|---|---|
| JP | 7-66114 | 3/1995 |
| JP | 2000-194142 | 7/2000 |
| JP | 2001-068411 | 3/2001 |
| JP | 2005-191444 | 7/2005 |
| JP | 2006-203183 | 8/2006 |
| JP | 2007-299994 | 11/2007 |
| JP | 2008-4928 | 1/2008 |
| JP | 2008-116272 | 5/2008 |
| JP | 2008-183732 | 8/2008 |
| WO | WO 2007/004552 A1 | 1/2007 |

OTHER PUBLICATIONS

Decision of a Patent Grant issued by the Japanese Patent Office on Nov. 30, 2010, for Japanese Patent Application No. 2008-240760, and English-language translation thereof.

* cited by examiner

*Primary Examiner* — Frederick Parker
*Assistant Examiner* — Alex Rolland
(74) *Attorney, Agent, or Firm* — Finnegan, Henderson, Farabow, Garrett & Dunner, L.L.P.

(57) ABSTRACT

A patterning method according to an embodiment of the present invention comprises: acquiring information about a surface state of an underlying film formed on a substrate; determining, based on the surface state, whether irregularity/foreign matter is present in each shot region in which a pattern is to be formed; and solidifying a resist agent while a first template, when it is determined that no irregularity/foreign matter is present in the shot region, or a second template that is different from the first template, when it is determined that irregularity/foreign matter is present in the shot region, is brought close to the underlying film on the shot region at a certain distance with the resist agent therebetween.

10 Claims, 7 Drawing Sheets

FIG.3
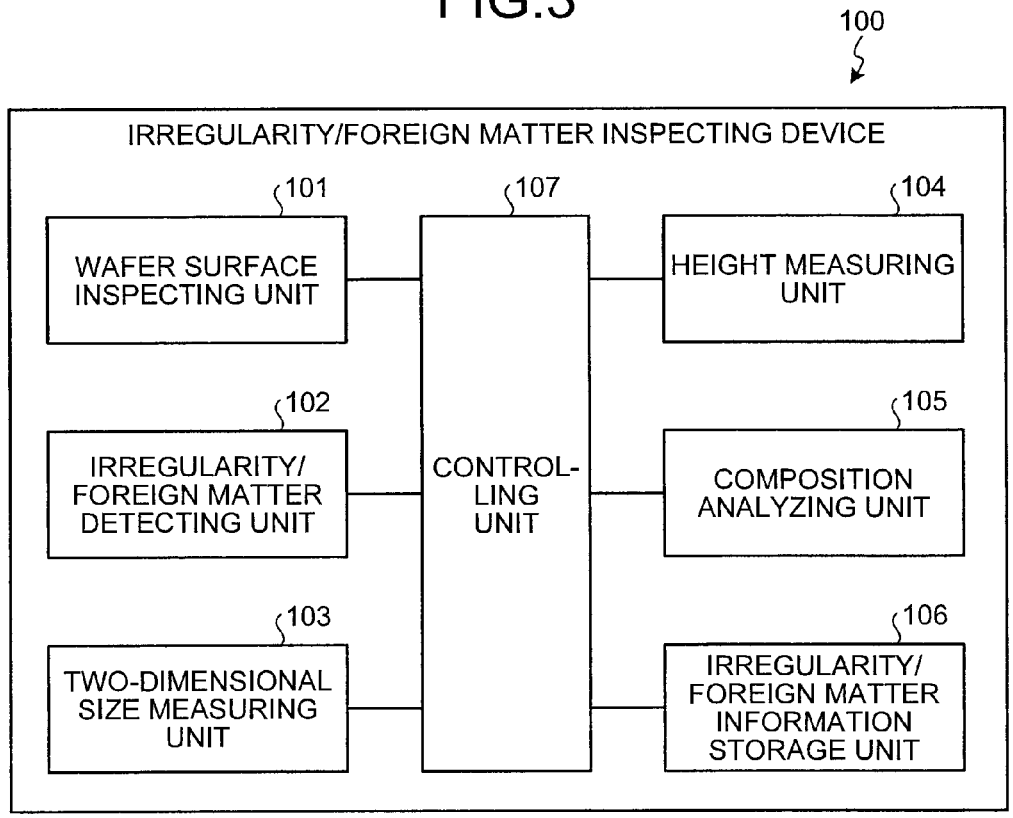
FIG.4A
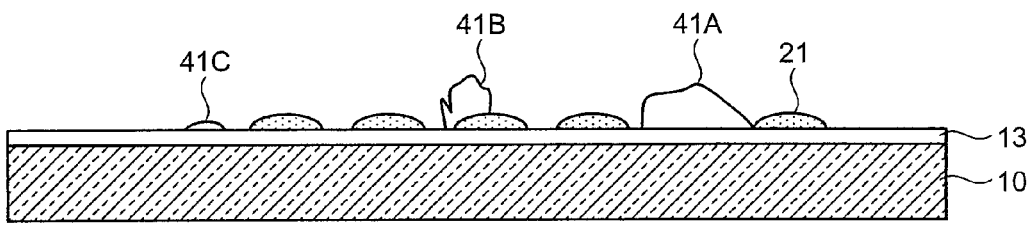
FIG.4B
| PARTICLE | POSITION | TWO-DIMENSIONAL SIZE | HEIGHT | MATERIAL | IMPRINTABILITY DETERMINATION |
|---|---|---|---|---|---|
| 41A | P1 | × | × | ○ | ○ |
| 41B | P2 | ○ | × | × | × |
| 41C | P3 | ○ | ○ | × | ○ |

PATTERNING METHOD

CROSS-REFERENCE TO RELATED APPLICATIONS

This application is based upon and claims the benefit of priority from the prior Japanese Patent Application No. 2008-240760, filed on Sep. 19, 2008; the entire contents of which are incorporated herein by reference.

BACKGROUND OF THE INVENTION

1. Field of the Invention

The present invention relates to a patterning method in nano-imprint lithography.

2. Description of the Related Art

In recent years, a problem in a photolithography step employed in a process of manufacturing a semiconductor device has become significant as semiconductor devices have become finer. That is, the current design rule of the state-of-the-art semiconductor device is as fine as several dozen nm half-pitch (hp); therefore, the conventional lithography by reduced pattern transfer using light does not provide sufficient resolution, and patterning is difficult to perform. To solve this problem, a nano-imprint technique has recently been proposed as an alternative to the lithography.

In the nano-imprint techniques disclosed, for example, in Japanese Patent Application Laid-open No. 2001-68411 and Japanese Patent Application Laid-open No. 2000-194142, an original mold (template) on which a pattern to be transferred is formed in advance is brought into contact with an organic material applied onto a substrate as a processing subject, and the organic material is cured by irradiating light, or by heating, thereby transferring the pattern on an organic material layer. In the nano-imprint technique, there are less variable factors such as focal depth, aberration, and an exposure amount, which have been a problem in the conventional lithography using light, and pattern transfer can be performed very simply, and accurately when a highly precise imprint mask is completed. That is, the nano-imprint technique is a patterning method that can form a very fine structure at low cost.

However, as has been explained, in the nano-imprint technique, a template and a processed substrate are brought into contact with each other, or brought close to each other to perform pattern transfer, and accordingly if, for example, irregularity, or a foreign matter such as particles is present on the surface of the processed substrate, a template may be chipped or cracked to be corrupted due to the irregularity, or the foreign matter. When the corrupted template is further used, patterns to be formed have common defects.

Japanese Patent Application Laid-open No. 2007-299994 discloses a technique about a machining device including a cleaning device for removing dusts adhered to a wafer surface. However, the technique has a problem that rapid pattern transfer cannot be performed due to the additional process of cleaning.

BRIEF SUMMARY OF THE INVENTION

A patterning method for forming a pattern by transferring a concavo-convex pattern formed on a first template in a resist agent arranged between an underlying film formed on a substrate and the first template, the patterning method according to an embodiment of the present invention comprises: forming the underlying film on the substrate; acquiring information about a surface state of the underlying film; determining, based on the surface state, whether irregularity or foreign matter is present in a shot region in which a pattern is to be formed by the first template; forming a pattern corresponding to the concavo-convex pattern formed on the first template by solidifying the resist agent while the first template is brought close to the underlying film on the shot region at a certain distance with the resist agent therebetween when it is determined, at the determining, that no irregularity or foreign matter is present in the shot region; and solidifying the resist agent while a second template different from the first template is brought close to the underlying film on the shot region at a certain distance with the resist agent therebetween when it is determined, at the determining, that irregularity or foreign matter is present in the shot region.

A patterning method for forming a pattern by transferring a concavo-convex pattern formed on a first template in a resist agent applied on an underlying film formed on a substrate, the patterning method according to an embodiment of the present invention comprises: forming the underlying film on the substrate; acquiring information about a surface state of the underlying film; applying the resist agent on the substrate on which the underlying film is formed; determining, based on the surface state, whether irregularity or foreign matter is present in a shot region on which a pattern is to be formed by using the first template after the applying the resist agent; forming a pattern corresponding to the concavo-convex pattern formed on the first template by solidifying the resist agent while the first template is brought close to the underlying film on the shot region at a certain distance with the resist agent therebetween when it is determined, at the determining, that no irregularity or foreign matter is present in the shot region; and solidifying the resist agent while a second template different from the first template is brought close to the underlying film on the shot region at a certain distance with the resist agent therebetween when it is determined, at the determining, that irregularity or foreign matter is present in the shot region.

BRIEF DESCRIPTION OF THE DRAWINGS

FIG. 3 is a block diagram of an irregularity/foreign matter inspecting device according to the first embodiment;

FIG. 4A is a schematic of irregularity/foreign matter present on a wafer;

FIG. 4B is an exemplary table of an imprintability determination result about the irregularity/foreign matter in FIG. 4A;

DETAILED DESCRIPTION OF THE INVENTION

Exemplary embodiments of patterning method according to the present invention will be explained below in detail with reference to the accompanying drawings. The present invention is not limited to the following embodiments. An imprint mask used in the following exemplary embodiments is shown only schematically in cross sections, and is not drawn to scale.
First Embodiment In a first embodiment of the present invention, after an underlying film is formed on a wafer, irregularity/foreign matter inspection is performed. When no irregularity/foreign matter is present in a shot region, imprinting is performed by using a first template. When irregularity/foreign matter is present in the shot region, imprinting is performed by using a second template that is a dummy template and is allowed to be hurt. The irregularity/foreign matter is the one that may corrupt the first template, and also may be the one that generates defects on a transferred pattern. In the following example, the irregularity/foreign matter is the one that may corrupt the first template.

Figure 1:
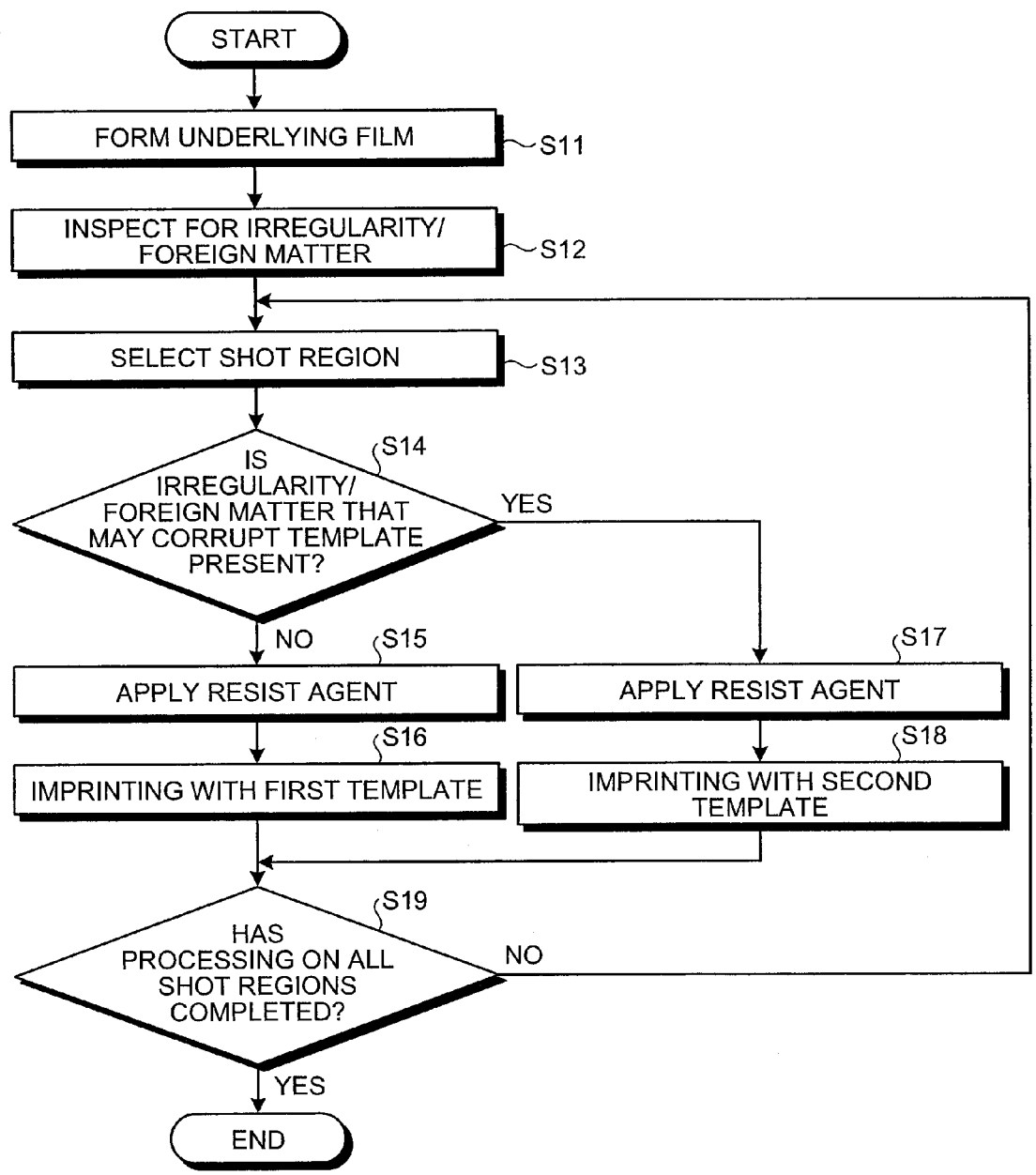
FIG. 1 is a flowchart of an example of a patterning method according to a first embodiment of the present invention.

FIG. 1 is a flowchart of an example of a patterning method according to the first embodiment. FIGS. 2A to 2G are cross-sectional views for explaining a processing procedure of steps of the patterning method according to the first embodiment. An underlying film 13 including a processed film 11 to be a subject of etching, and a mask film 12 such as a silicon oxide to be a hard mask is formed on a wafer 10 such as a silicon substrate (Step S11, FIG. 2A). Specifically, a film to be a base for forming an element such as a field-effect transistor, a resistance, and a capacitive element, and wiring, and then a spin-on-glass (SOG) as the mask film 12 are formed on the wafer 10.

Irregularity/foreign matter inspection is performed on the entire surface of the wafer 10 on which the underlying film 13 is formed to determine whether irregularity caused by undulation of the surface of the wafer 10, and a foreign matter such as a particle is present (Step S12). In the irregularity/foreign matter inspection, at least one of the following is obtained together with the position of irregularity/foreign matters 41 on the wafer 10: two-dimensional size of the irregularity/foreign matters 41 present on the surface of the wafer 10 in directions parallel to a substrate surface, height of the irregularity/foreign matters 41 in a direction vertical to the substrate surface, and the composition of the irregularity/foreign matters 41. Although it is desirable to obtain all the pieces of information, an inspection subject is selected considering the time required for the processing, and the cost necessary for the inspection. In this example, the two-dimensional size, the height, and the composition of the irregularity/foreign matters 41 are obtained. The position, the two-dimensional size, the height, and the composition of the irregularity/foreign matters 41 obtained are used in the following steps as irregularity/foreign matter information.

FIG. 3 is a block diagram of an irregularity/foreign matter inspecting device. An irregularity/foreign matter inspecting device 100 includes a wafer surface inspecting unit 101, an irregularity/foreign matter detecting unit 102, a two-dimensional size measuring unit 103, a height measuring unit 104, a composition analyzing unit 105, an irregularity/foreign matter information storage unit 106, and a controlling unit 107 that controls these processing units.

The wafer surface inspecting unit 101 scans the surface of the wafer 10 by irradiating with light having wavelength in an ultraviolet range, and receives the reflected light, or the scattered light to obtain wafer surface state information showing the state of the surface of the wafer 10.

The irregularity/foreign matter detecting unit 102 has a function of detecting irregularity/foreign matter together with the position of the same on the wafer 10 from the wafer surface state information obtained by the wafer surface inspecting unit 101. For example, when the wafer surface state information is obtained as image data, a region having a contrast different from that of the surrounding region is detected as irregularity/foreign matter. The position of the irregularity/foreign matter on the wafer 10 obtained in this process is stored in the irregularity/foreign matter information storage unit 106.

The two-dimensional size measuring unit 103 measures the two-dimensional size of the irregularity/foreign matter detected by the irregularity/foreign matter detecting unit 102. The two-dimensional size may be represented by a dimension of the irregularity/foreign matter in the long axis direction, and a dimension in the short axis direction. Alternatively, only the dimension in the long axis direction may be measured. The two-dimensional size obtained in this process is associated with the position of the corresponding irregularity/foreign matter stored in the irregularity/foreign matter information storage unit 106, and stored therein.

The functions of the wafer surface inspecting unit 101, the irregularity/foreign matter detecting unit 102, and the two-dimensional size measuring unit 103 can be realized by a commercially-available optical inspecting device (for example, 2815 (product name) and Surfscan SP2 (product name) manufactured by KLA-Tencor Corporation).

The height measuring unit 104 measures the height of the irregularity/foreign matter detected by the irregularity/foreign matter detecting unit 102. The measured height is associated with the position of the corresponding irregularity/foreign matter stored in the irregularity/foreign matter information storage unit 106, and stored therein. The height measuring unit 104 can be realized by a commercially-available laser interferometer (for example, one manufactured by Zygo Corporation).

The composition analyzing unit 105 analyzes the composition of the irregularity/foreign matter detected by the irregularity/foreign matter detecting unit 102. For example, the composition analyzing unit 105 can be realized by a device such as a wavelength-dispersive, or an energy-dispersive X-ray fluorescence analyzer that can analyze the composition of a spot-like region on the surface of the wafer 10. The composition analysis just has to analyze elements included in irregularity/foreign matter, but may determine the quantity of the irregularity/foreign matter. The composition obtained in this process is associated with the position of the corresponding irregularity/foreign matter stored in the irregularity/foreign matter information storage unit 106, and stored therein.

The irregularity/foreign matter information storage unit 106 stores therein the irregularity/foreign matter information including the position on the wafer 10, the two-dimensional size, the height, and the composition of the irregularity/foreign matter detected on the wafer 10. Because the two-dimensional size, the height, and the composition of the irregularity/foreign matter are obtained in this example, the information including all of them is included in the irregularity/foreign matter information. However, when any one or two of the two-dimensional size, the height, and the composition of the irregularity/foreign matter is obtained, only the obtained information and the position on the wafer 10 are included in the irregularity/foreign matter information.

In the irregularity/foreign matter inspecting device 100, the wafer surface inspecting unit 101 inspects the surface of the wafer 10 (the underlying film 13) and acquires the wafer surface information, and the irregularity/foreign matter detecting unit 102 extracts the positional information of irregularity/foreign matter from the wafer surface information and stores the positional information in the irregularity/foreign matter information storage unit 106. Then, the two-dimensional size measuring unit 103 measures the two-dimensional size (for example, major axis) of the irregularity/foreign matter based on the positional information of the irregularity/foreign matter, the height measuring unit 104 measures the height, and the composition analyzing unit 105 analyzes the composition (for example, constituent elements). All the results are associated with the corresponding positional information, and are stored in the irregularity/foreign matter information storage unit 106. In this way, information of irregularity/foreign matter on the underlying film 13 is obtained.

The configuration of the irregularity/foreign matter inspecting device 100 is merely an example, and the two-dimensional size, the height, and the composition of the irregularity/foreign matter may be separately obtained by different devices.

Then, a single shot region R1 as a processing subject on the underlying film 13 is selected (Step S13), and it is determined whether irregularity/foreign matter that may corrupt a template is present in the selected shot region based on the irregularity/foreign matter information (Step S14). Specifically, the irregularity/foreign matter information included in the coordinate range of the selected shot region is extracted, and it is determined whether the two-dimensional size, the height, and the material of the irregularity/foreign matter satisfy a preset imprintability criterion value at which the template is not corrupted when a pattern is formed by binging the template into contact with an imprint material on the surface of the wafer 10.

An example of a determination method is explained. The imprintability criterion value in this example includes a criterion value about two-dimensional size, a criterion value about height, and a criterion about material (composition), and whether imprinting can be executed is determined by considering the criteria comprehensively. For example, the criterion value about two-dimensional size at which imprinting can be executed is 15 µm or less, the criterion value about height is 10 µm or less, and the criterion about material is, when a template is made of $SiO_2$, that SiO and SiN are not included.

FIG. 4A is a schematic of irregularity/foreign matters present on a wafer. FIG. 4B is a table of an example of the imprintability determination result about irregularity/foreign matter. It is assumed, as shown in FIG. 4A, a foreign matter 41A (position P1), a foreign matter 41B (position P2), and a foreign matter 41C (position P3) are detected on the wafer 10. In FIG. 4B, whether each of the imprintability criterion values about two-dimensional size, height, and material of the foreign matters 41A to 41C at the positions P1 to P3 on the wafer 10 is satisfied, and imprintability determination results are shown. Specifically, if each of the imprintability criterion values about two-dimensional size, height, and material of the foreign matters 41A to 41C at the positions P1 to P3 on the wafer 10 is satisfied, "O" is filled in, and if not, "X" is filled in. For example, while the two-dimensional size and the height of the foreign matter 41A at the position P1 do not satisfy the criterion values about two-dimensional size and height, the material satisfies the criterion about material. While the two-dimensional size of the foreign matter 41B at the position P2 satisfies the criterion value about two-dimensional size, the height, and the material of the foreign matter 41B do not satisfy the criterion value about height, and the criterion about material. Furthermore, while the two-dimensional size and the height of the foreign matter 41C at the position P3 satisfy the criteria values about the two-dimensional size and the height, the material of the foreign matter 41C does not satisfy the criterion about material.

In this example, when it is determined whether imprinting can be executed, determination is first made about material, and if the material satisfies the criterion, in other words, if the material is softer than a template, it is determined that imprinting can be executed whatever the results about the other conditions (i.e., the results about two-dimensional size and height) may be. If the material does not satisfy the criterion, in other words, if the material is harder than the template, it is determined whether imprinting can be executed by further using the two-dimensional size and the height.

For example, regarding the foreign matter 41A at the position P1, because the material satisfies the criterion, it is determined that imprinting can be executed even if the two-dimensional size and the height exceed the criterion values. As regards the foreign matter 41B at the position P2, because the material does not satisfy the criterion, determination is made by further using the height and the size, but because the height does not satisfy the criterion value, the risk of corrupting the template is high when imprinting is executed, and accordingly it is determined that imprinting cannot be executed. Furthermore, as regards the foreign matter 41C at the position P3, because, while the material does not satisfy the criterion, the height, and the size both satisfy the criterion values, the risk of corrupting the template is low even if imprinting is executed, and accordingly it is determined that imprinting can be executed.

Imprintability criterion values can be decided based on (1) whether an abnormality has occurred on a template when imprinting is performed in the presence of particular irregularity/foreign matter, and (2) whether an abnormality has occurred on a pattern formed by the patterning method. For example, the abnormality on the template in (1) indicates that a pattern dimension/position is out of tolerance, and an abnormality on the pattern in (2) indicates that the pattern formed by the patterning method is not as designed. For example, when the imprintability criterion value is set with (1) as the criterion, the criterion values about two-dimensional size and height become larger, and of micron-scale, and when the imprintability criterion value is set with (2) as the criterion, the criterion values about two-dimensional size and height become smaller than the criterion values in the case of (1) (generally, values of submicron-scale or smaller).

Figure 2A:
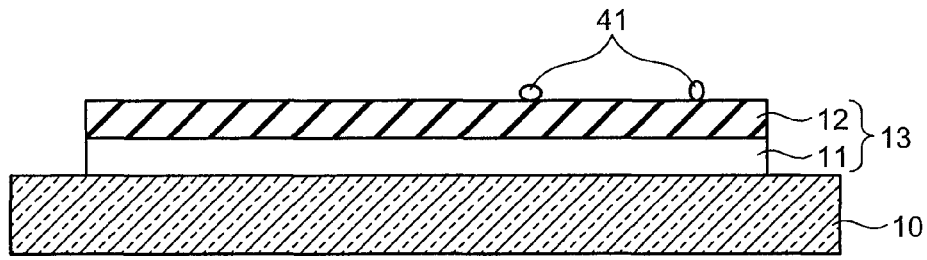
FIG. 2A is a cross-sectional view for explaining a processing procedure of steps of the patterning method according to the first embodiment.
Figure 2B:
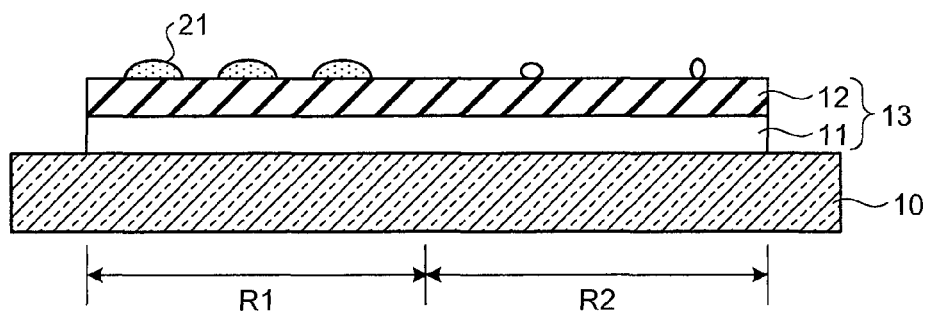
FIG. 2B is a cross-sectional view for explaining a processing procedure of steps of the patterning method according to the first embodiment.
Figure 2C:
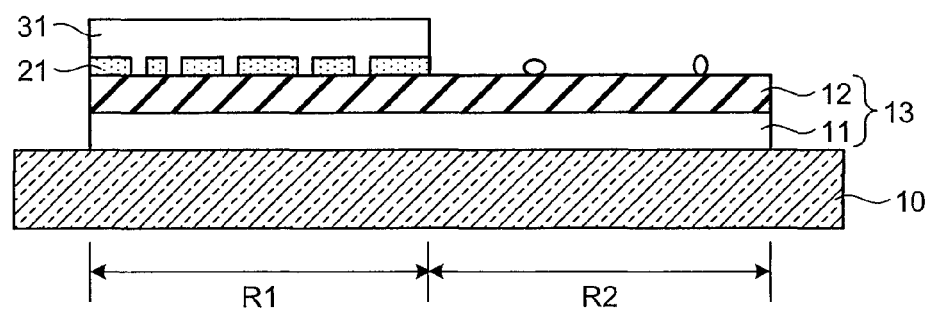
FIG. 2C is a cross-sectional view for explaining a processing procedure of steps of the patterning method according to the first embodiment.
Figure 2D:
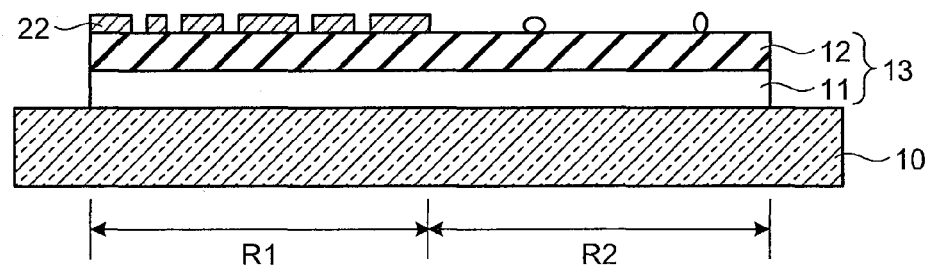
FIG. 2D is a cross-sectional view for explaining a processing procedure of steps of the patterning method according to the first embodiment.
Figure 2E:
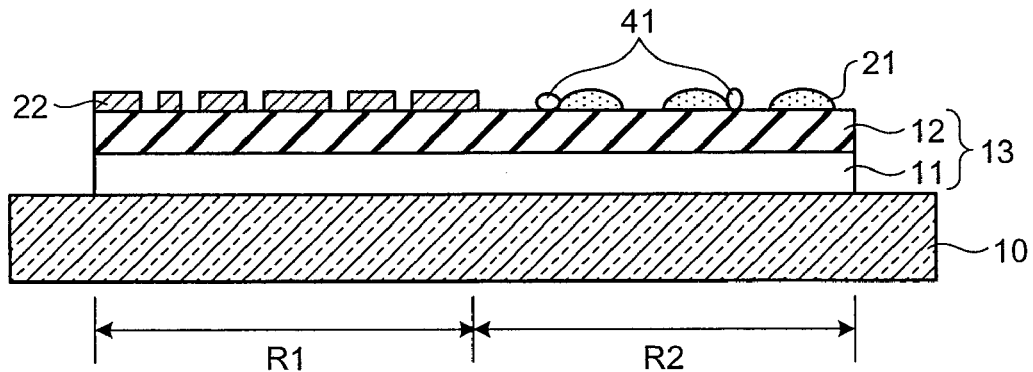
FIG. 2E is a cross-sectional view for explaining a processing procedure of steps of the patterning method according to the first embodiment.

In this way, when it is determined that the irregularity/foreign matter 41 that prevents imprinting is not present in the selected shot region as a result of the irregularity/foreign matter determination (NO at Step S14), a resist agent 21 is applied to the selected shot region R1 (Step S15, FIG. 2B), the first template 31 is arranged on the shot region R1 in which the resist agent 21 is applied, the resist agent 21 on the surface of the wafer 10 is solidified while the first template 31 and the resist agent 21 are brought into contact with each other, and imprinting is performed (Step S16, FIGS. 2C to 2D). Thereby, a resist pattern (pattern) 22 corresponding to a concavo-convex pattern formed on the first template 31 is formed.

Specifically, the first template 31 is arranged such that the surface on which a concavo-convex pattern is formed faces the shot region R1 in which the resist agent 21 is applied, the position of the first template 31 is aligned, and the first template 31 and the resist agent 21 on the surface of the wafer 10 are brought into contact with each other (FIG. 2C). During a certain time period until the resist agent 21 is filled in the concavo-convex patterns of the first template 31 after the positional relationship between the first template 31, and the wafer 10 is fixed, light beam such as ultraviolet light is irradiated on the shot region R1, or heat is applied to the shot region R1 to solidify the resist agent 21. By removing the first template 31 from the wafer 10, the resist pattern 22 is formed on the underlying film 13 (FIG. 2D).

Figure 2F:
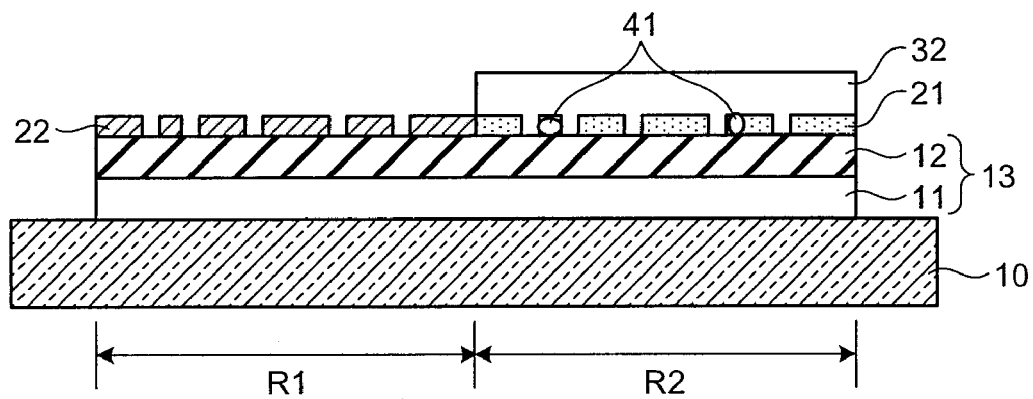
FIG. 2F is a cross-sectional view for explaining a processing procedure of steps of the patterning method according to the first embodiment.
Figure 2G:
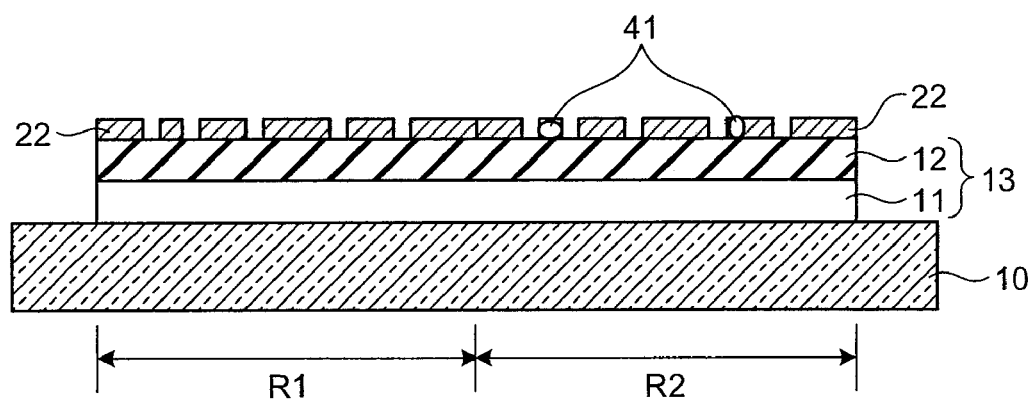
FIG. 2G is a cross-sectional view for explaining a processing procedure of steps of the patterning method according to the first embodiment.

On the other hand, when it is determined that the irregularity/foreign matter 41 that prevents imprinting is present in the selected shot region R2 (YES at Step S14), the resist agent 21 is applied to the selected shot region R2 (Step S17, FIG. 2E), a second template 32 that is a dummy template is arranged on the shot region R2 to which the resist agent 21 is applied, and the resist agent 21 on the surface of the wafer 10 is solidified while the second template 32 and the resist agent 21 are brought into contact with each other (Step S18, FIGS. 2F to 2G).

The purpose of solidifying the resist agent 21 in the shot region R2 in which the irregularity/foreign matter 41 that prevents imprinting is present at Steps S17, and S18 is for leveling the height of the entire wafer 10 when an SOG film is etched after a pattern is formed on the entire wafer 10. Therefore, the amount of the resist agent 21 is adjusted so that the height of the entire wafer 10 becomes level with the resist pattern 22 formed by using the first template 31.

The second template 32 used at Step S18 is, unlike the first template 31 used at Step S16, a template that is allowed to be corrupted by irregularity/foreign matter harder than the template, or a template formed by a material that has elasticity, such as rubber and resin that are not corrupted by irregularity/foreign matter harder than the template. For example, the second template 32 is a template that has been used in the past and is corrupted, a template that is fabricated, but does not satisfy a usage criterion as a template, and a template exclusive for the use made of rubber or resin. Irregularity for forming a pattern may or may not be formed on the second template 32. In order to realize uniform etching in a region on the wafer 10, the second template 32 on which irregularity for forming a pattern is formed, especially the second template 32 on which irregularity for forming a shape same as that of the surrounding shot region is formed, or the template 32 on which irregularity that can achieve coverage equivalent to that of the surrounding shot region is formed is desirably used. Furthermore, at Step S18, the applied resist agent 21 may be solidified as it is (without a template being pressed against) without using the dummy second template 32.

Thereafter, or after Step S16, it is determined whether imprinting is performed on all the shot regions on the wafer 10 (Step S19), and if not (NO at Step S19), the process returns to Step S13, and the above processing is repeated until imprinting is completed on all the shot regions. If imprinting is completed on all the shot regions (YES at Step S19), the patterning method ends.

Thereafter, processes similar to a normal semiconductor device manufacturing method are performed. That is, the mask film 12 such as a SOG film is etched using the formed resist pattern 22 to form a hard mask, and the processed film 11 is patterned to have a predetermined pattern using the hard mask to manufacture a semiconductor device.

Figure 5:
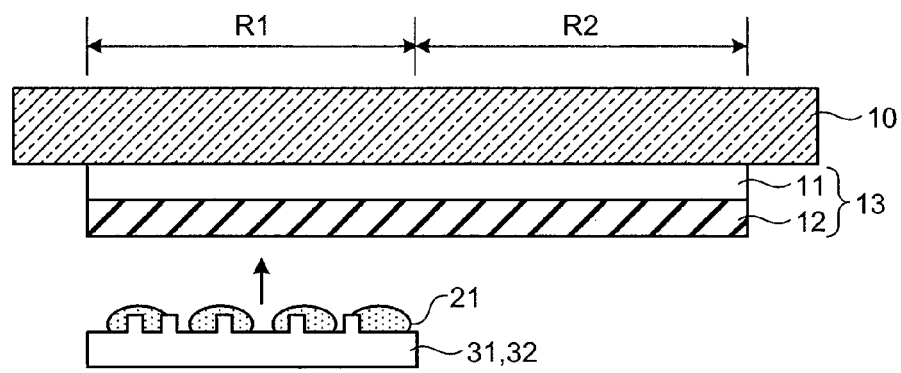
FIG. 5 is a schematic of another example of imprinting.

FIG. 5 is a schematic of another example of imprinting. While the templates 31 and 32 are brought into contact with each other after the resist agent 21 is applied on the wafer 10 in the example explained above, a pattern may be formed by applying the resin pattern 21 on the surfaces of the templates 31 and 32 on which concavo-convex patterns are formed, and making the templates 31 and 32 face each other, and contact with the surface of the wafer 10 on which the underlying film 13 is formed as shown in FIG. 5.

Furthermore, if in the irregularity/foreign matter determination at Step S12, a lot of the irregularity/foreign matter information is accumulated, and there is a certain tendency in the irregularity/foreign matter information, for example, when the two-dimensional size and the height or the composition of the irregularity/foreign matter are correlated with each other, it is possible to estimate, at a certain level of possibility, the height, and the composition of the irregularity/foreign matter from the two-dimensional size of the irregularity/foreign matter. In such a case, the height, and the composition of all the irregularity/foreign matter are not measured, nor analyzed, but the height, and the composition of the irregularity/foreign matter are estimated only from the two-dimensional size. In this way, the time required for irregularity/foreign matter inspection can be shortened.

Although in the example explained above, the device that inspects for irregularity/foreign matter, and the device that performs imprinting are separate devices, these processes may be executed by a single device. In the following, an imprinting device that executes irregularity/foreign matter inspection for obtaining the two-dimensional size of irregularity/foreign matter and imprinting within a single casing is explained.

Figure 6:
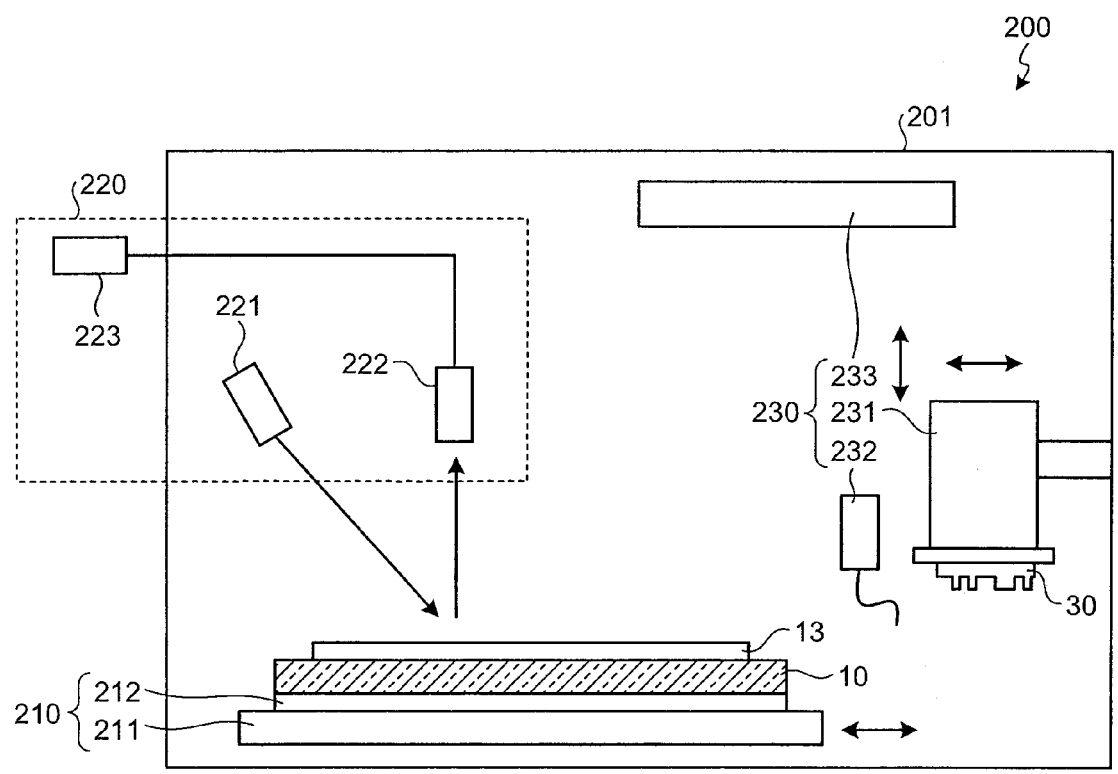
FIG. 6 is a schematic of an example of the configuration of an imprinting device according to the first embodiment.

FIG. 6 is a schematic of an example of the configuration of an imprinting device according to the first embodiment. An imprinting device 200 includes, within a chamber 201, a substrate holding unit 210 that holds the wafer 10 including the underlying film 13, a wafer surface inspecting unit 220 that inspects for irregularity/foreign matter on the wafer 10 (underlying film 13), and an imprinting unit 230 that performs imprinting on a shot region on the wafer 10 (underlying film 13).

The substrate holding unit 210 includes a movable wafer stage 211 on which the wafer 10 is placed, and a wafer chuck 212 that holds and fixes the wafer 10 on the wafer stage 211.

The wafer surface inspecting unit 220 includes a light irradiating unit 221 that irradiates radiation (for example, ultraviolet light, X-ray, and electron beam) to be an inspecting probe on the surface of the wafer 10 held on the wafer stage 211, a detecting unit 222 that detects the radiation reflected by the surface of the wafer 10 and the radiation released from the surface of the wafer 10, and an amplifier 223 that amplifies a signal detected by the detecting unit 222. Although not shown in the figures, a processing unit for detecting irregularity/foreign matter, measuring the size, and analyzing the composition is further connected to the amplifier 223.

The imprinting unit 230 includes a template holding unit 231 that holds the template 30, and is movable on the horizontal surface and in the vertical direction, a resist agent applying unit 232 that applies the resist agent 21 on the wafer 10, and a resist solidifying unit 233 that irradiates the resist agent 21 with ultraviolet light, and solidifies the resist agent 21. When the resist agent 21 is made of a material that cures by heating, the resist solidifying unit 233 has to be able to heat the resist agent 21. In this case, a substrate heater or the like is provided, in the wafer stage 211, as the resist solidifying unit 233.

Although not shown in FIG. 6, the first template 31 and the second template 32 can be replaced with each other. That is, when no irregularity/foreign matter that may corrupt the first template 31 is present in a shot region of the wafer 10, imprinting is performed by attaching the first template 31 on the template holding unit 231. When irregularity/foreign matter that may corrupt the first template 31 is present in a shot region, imprinting is performed by attaching the second template 32 on the template holding unit 231.

With a device that has such a configuration, imprinting can be performed by the method explained above.

According to the first embodiment, it is determined whether the irregularity/foreign matter 41 that may corrupt the first template 31 is present on the underlying film 13 after forming the underlying film 13 on the wafer 10, the dummy second template 32 that is allowed to be corrupted after applying the resist agent 21 is pressed against a part where the irregularity/foreign matter 41 that may corrupt the first template 31 is present, and then the resist agent 21 is solidified. As a result, it becomes possible to prevent the first template 31 for patterning from being corrupted due to the influence of the presence of the irregularity/foreign matter 41, and to extend the lifetime of the template.

Second Embodiment

While in the first embodiment, the resist agent is applied for each shot region, the resist agent is applied to the entire surface of the wafer in a second embodiment of the present invention.

Figure 7:
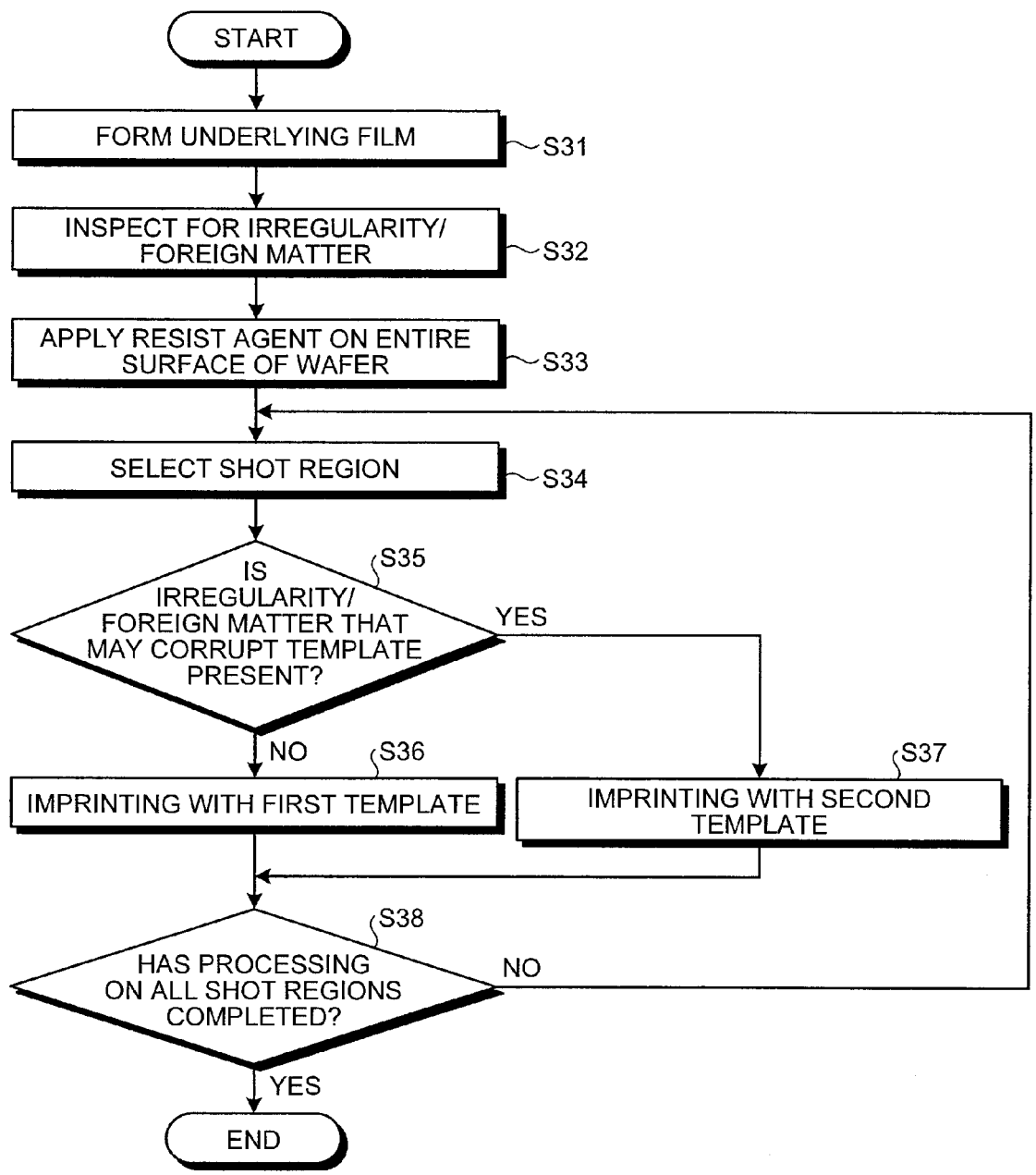
FIG. 7 is a flowchart of an example of the patterning method according to a second embodiment of the present invention.

FIG. 7 is a flowchart of an example of the patterning method according to the second embodiment. As at Steps S11 to S12 in the first embodiment, irregularity/foreign matter inspection is performed on the entire surface of the wafer 10 on which an underlying film is formed (Steps S31 to S32).

A resist agent is applied on the entire surface of the underlying film of the wafer (Step S33), and a shot region as a processing subject on the under laying film is selected (Step S34). Thereafter, by a method similar to that explained in the first embodiment, it is determined whether irregularity/foreign matter that may corrupt the first template is present in the selected shot region based on the irregularity/foreign matter information (Step S35).

If it is determined, as a result of the irregularity/foreign matter determination, that no irregularity/foreign matter that prevents imprinting is present in the selected shot region (NO at Step S35), the first template is arranged on the shot region to which the resist agent is applied as explained at Step S16 in FIG. 1 in the first embodiment, and the resist agent is solidified, and imprinting is performed while the first template is brought into contact with the resist agent on the wafer surface; thereby, a pattern is formed (Step S36). When the resist agent is solidified, the resist agent only of the selected shot region is solidified. Accordingly, an effective method is one in which a light-curing resin is used as the resist agent, and light is irradiated only in the selected shot region when the resist agent is solidified.

On the other hand, if it is determined that irregularity/foreign matter that prevents imprinting is present in the selected shot region (YES at Step S35), as explained at Step S18 in FIG. 1 in the first embodiment, the dummy second template is arranged on the shot region to which the resist agent is applied, and the resist agent is solidified while the second template is brought into contact with the resist agent on the wafer surface (Step S37). In this case also, when the resist agent is solidified, the resist agent only of the selected region is solidified.

As in the first embodiment, the purpose of solidifying the resist agent in a shot region in which irregularity/foreign matter that prevents imprinting is present at Step S37 is for leveling the height of the entire wafer when a mask film is etched after a pattern is formed on the entire wafer.

The dummy second template used at Step S37 is a template that is allowed to be corrupted by irregularity/foreign matter harder than the template, or a template formed by a material that has elasticity, such as rubber and resin that are not corrupted by irregularity/foreign matter harder than the template. Irregularity for forming a pattern may or may not be formed on the second template. In order to realize uniform etching in a region on the wafer, the second template on which irregularity for forming a pattern is formed, especially the second template on which irregularity for forming a pattern having a shape same as that of the surrounding shot region is formed, or the second template on which irregularity that can achieve coverage equivalent to that of the surrounding shot region is formed is desirably used. Furthermore, at Step S37, the applied resist agent may be solidified as it is (without a template being pressed against) without using the dummy second template.

It is determined whether imprinting is performed on all the shot regions on the wafer (Step S38), and if not (NO at Step S38), the process returns to Step S34, and the above processing is repeated until imprinting is completed on all the shot regions. If imprinting is completed on all the shot regions (YES at Step S38), the patterning method ends.

Thereafter, the mask film is etched by using the formed pattern to form a hard mask, and the processed film is patterned to have a predetermined pattern using the hard mask. Because these processes are similar to a normal semiconductor device manufacturing method, it is not explained here.

Effects similar to those of the first embodiment can be obtained by the second embodiment.

Third Embodiment

In a third embodiment of the present invention, it is determined whether abnormality has occurred on a template at each shot to avoid use of a template that may be corrupted.

Figure 8:
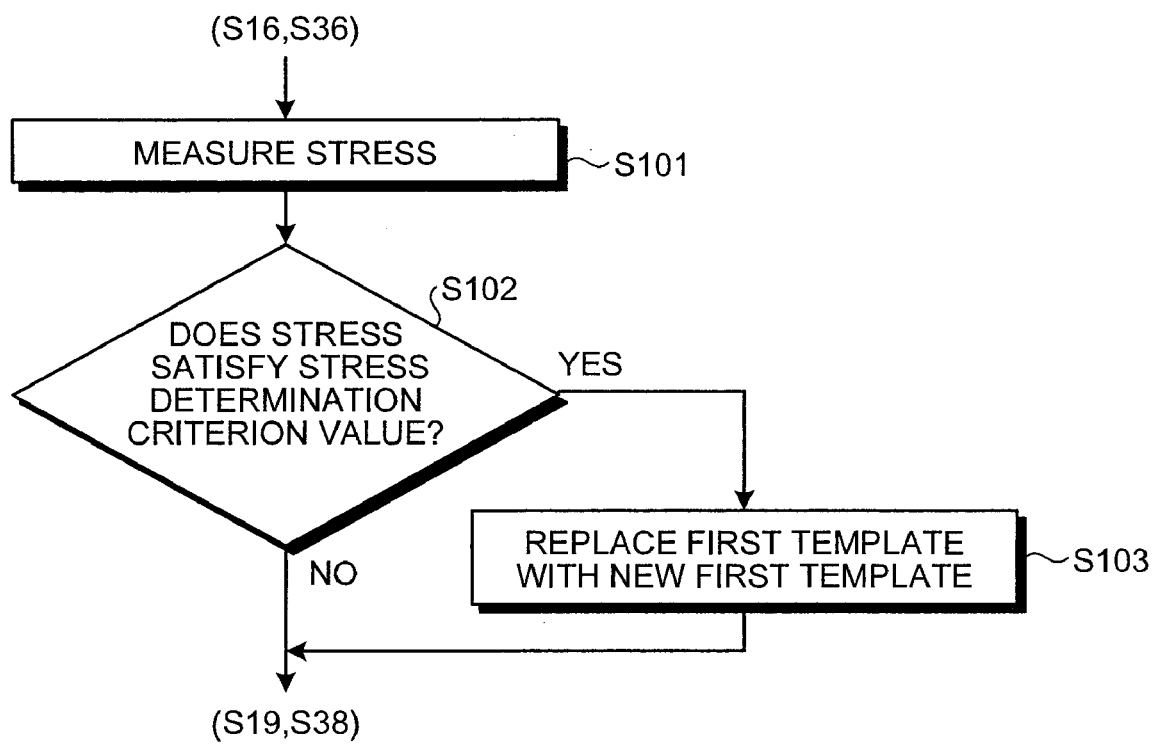
FIG. 8 is a flowchart of an example of the patterning method according to a third embodiment of the present invention.

FIG. 8 is a flowchart of an example of the patterning method according to the third embodiment. In the third embodiment, when imprinting is performed by using the first template in the first and the second embodiments (Steps S16 and S36), stress on the first template or the wafer is measured (Step S101).

In this example, when imprinting is performed, after the wafer and the template are aligned to each other, the template and the wafer are moved by a predetermined moving amount, and the resist agent is solidified. In this process, when no irregularity/foreign matter is present in the shot region, even if the template and the wafer are brought closer to each other and the resist agent is solidified, the template and the wafer do not receive stress. However, when irregularity/foreign matter that is made of a material harder than the template, and has the height higher than the imprintability criterion value is present, the template receives stress in a direction away from the wafer and the wafer receives stress in a direction away from the template when the template is moved by a predetermined amount, and brought closer to the wafer.

In the third embodiment, stress that the template or the wafer receives is measured at the time of imprinting, and thereby it is determined whether irregularity/foreign matter is present in a shot region. Methods of measuring stress that the template or the wafer receives in this way include, for example, a method of converting pressure on a holder that holds the template or a wafer chuck that holds the wafer into an electric signal, and sensing the signal by a sensor, specifically, a method of obtaining stress by measuring stress on piezo elements installed at predetermined positions (for example, four corners) of the template holding unit that holds the template or the wafer chuck that holds the wafer, and a method of measuring the moving amount of the holder.

Thereafter, it is determined whether the stress on the first template or on the wafer satisfy the preset template replacement criterion value at which the first template needs to be replaced (Step S102). If the stress on the first template or on the wafer satisfies the template replacement criterion value (YES at Step S102), the currently used first template is replaced with a new, uncorrupted (different from the currently used first template) first template (Step S103).

Thereafter, or if the stress on the first template or the wafer do not satisfy the template replacement criterion value at Step S102 (NO at Step S102), because the possibility that the currently used first template is corrupted is low, the currently used first template is used in the process of imprinting a next shot region without being replaced with another one, and the steps after imprinting in the first and the second embodiments (Steps S19 and S38) are executed.

In the third embodiment, stress on the wafer or the first template is measured at each imprinting, and when the stress satisfies a predetermined template replacement criterion value, the first template is replaced. Thereby, a defect can be prevented from being generated on a pattern formed by imprinting in the next, and the following shot regions due to the corrupted first template. In addition, it becomes possible to prevent a common defect from being generated on a patter after imprinting due to the defect generated on the first template.

As can be seen, the exemplary embodiments of the present invention can provide a patterning method that can prevent a template from being corrupted due to irregularity and a foreign matter present on a processed substrate at the time of patterning on the processed substrate using nano-imprinting.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A patterning method for forming a pattern by transferring a concavo-convex pattern formed on a first template in a resist agent arranged between an underlying film formed on a substrate and the first template, the patterning method comprising:
    forming the underlying film on the substrate;
    acquiring information about a surface state of the underlying film;
    determining, based on the surface state, whether irregularity or foreign matter is present in a shot region in which a pattern is to be formed by the first template;
    forming a pattern corresponding to the concavo-convex pattern formed on the first template by solidifying the resist agent while the first template is brought close to the underlying film on the shot region at a certain distance with the resist agent therebetween when it is determined, at the determining, that no irregularity or foreign matter is present in the shot region; and
    solidifying the resist agent while a second template different from the first template is brought close to the underlying film on the shot region at a certain distance with the resist agent therebetween when it is determined, at the determining, that irregularity or foreign matter is present in the shot region.

2. The patterning method according to claim 1, wherein when it is determined, at the determining, that irregularity or foreign matter is present, the resist agent is solidified by using the second template such that the height of the pattern after the resist agent is solidified is level with the height of the pattern in the shot region formed by using the first template.

3. The patterning method according to claim 2, wherein the second template is a template in which no pattern is formed, or a template in which a pattern having a coverage same as that of the first template is formed.

4. The patterning method according to claim 1, wherein the irregularity or the foreign matter is irregularity or foreign matter that is likely to corrupt the first template at imprinting.

5. The patterning method according to claim 4, the patterning method further comprising:
    after the solidifying the resist agent,
    measuring stress received by the first template or the substrate while the first template and the substrate are brought close to each other;
    determining whether the stress satisfies a criterion value at which the first template is likely to be corrupted; and
    replacing the first template with a template different from the first template when the stress satisfies the criterion value.

6. The patterning method according to claim 1, the method further comprising:
    acquiring image data as the information of the surface state; and
    acquiring a region having a contrast different from that of a surrounding region in the image data at the determining whether irregularity or foreign matter is present.

7. The patterning method according to claim 6, wherein the determining whether irregularity or foreign matter is present includes measuring at least one of a size and a composition of the region having the different contrast, and when the size or the composition does not satisfy an imprintability criterion value, determining that irregularity or foreign matter is present.

8. The patterning method according to claim 7, wherein the criterion value is a criterion value at which no abnormality occurs on the first template at the patterning in the presence of the irregularity or the foreign matter.

9. The patterning method according to claim 7, wherein the criterion value is a criterion value at which no abnormality occurs on a pattern formed on the underlying film by using a pattern formed on the resist.

10. The patterning method according to claim 1, wherein the second template is any of a template formed by a material having elasticity, a corrupted template, or a template that does not satisfy a usage criterion for the first template.

* * * * *